(12) United States Patent
Ishii

(10) Patent No.: US 7,626,406 B2
(45) Date of Patent: Dec. 1, 2009

(54) PROBING METHOD, PROBE APPARATUS AND STORAGE MEDIUM

(75) Inventor: Kazunari Ishii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/049,799

(22) Filed: Mar. 17, 2008

(65) Prior Publication Data
US 2008/0238455 A1  Oct. 2, 2008

(30) Foreign Application Priority Data
Mar. 30, 2007  (JP) ............................. 2007-095181

(51) Int. Cl.
*G01R 31/02* (2006.01)
(52) U.S. Cl. ...................... 324/758; 324/754
(58) Field of Classification Search ............... 324/72.5, 324/752–765, 158.1; 438/14–17
See application file for complete search history.

(56) References Cited

U.S. PATENT DOCUMENTS

| | | | | |
|---|---|---|---|---|
| 4,786,867 A | * | 11/1988 | Yamatsu | 324/758 |
| 4,963,822 A | * | 10/1990 | Prokopp | 324/758 |
| 5,436,571 A | * | 7/1995 | Karasawa | 324/765 |
| 5,773,987 A | * | 6/1998 | Montoya | 324/757 |
| 6,130,545 A | * | 10/2000 | Kiser et al. | 324/757 |
| 6,433,571 B1 | * | 8/2002 | Montoya | 324/762 |
| 6,933,737 B2 | * | 8/2005 | Sugawara | 324/754 |
| 2004/0046580 A1 | * | 3/2004 | Takemoto et al. | 324/754 |
| 2004/0239352 A1 | * | 12/2004 | Mizoguchi | 324/754 |

* cited by examiner

*Primary Examiner*—Ha Tran T Nguyen
*Assistant Examiner*—Arleen M Vazquez
(74) *Attorney, Agent, or Firm*—Oblon, Spivak, McClelland, Maier & Neustadt, L.L.P.

(57) ABSTRACT

A probing method measures electrical characteristics of an object to be inspected by bringing a probe needle to make a contact with an electrode pad of the object, the probe needle formed to be vertically pointing the object. The method includes the steps of: mounting the object on a mounting table; aligning the object and the probe needle; thereafter, contacting the probe needle with the electrode pad by moving the mounting table upwards, and then moving the mounting table vertically upwards while moving same horizontally to rend an oxide film formed on a surface of the electrode pad, so that a tip of the probe needle is stuck into the electrode pad and the probe needle and the electrode pad to conduct with each other.

11 Claims, 6 Drawing Sheets

PROBING METHOD, PROBE APPARATUS AND STORAGE MEDIUM

FIELD OF THE INVENTION

The present invention relates to a technique for measuring electrical characteristics of an object to be inspected by contacting electrode pads of the object to be inspected with probe needles.

BACKGROUND OF THE INVENTION

In a manufacturing process of a semiconductor device, after IC chips are manufactured, reliability of each individual chip is determined by performing various inspections of electrical characteristics on a wafer. A probe apparatus for performing the inspections is configured to mount a wafer on a mounting table; to align positions of the wafer and probe needles of a probe card; and to bring the probe needles to make contacts with electrode pads of the IC chips on the wafer. Conventionally, so-called "bent or horizontal needle" was mainly used as the probe needle, however, accompanying with high integration and miniaturization of IC chips, a vertical needle which contributes to arranging probes in a high density is widely used.

However, in a contact operation for contacting the electrode pads with the probe needles, it is required to rend a native oxide film formed on the surface of the electrode pad by the probe needle to secure a reliable electrical contact therebetween. Further, after the contact operation, a confirmation process is preformed to confirm whether a right contact was made or not by imaging needle marks with a camera. For an easy confirmation, it is also required to leave a reasonable size of the needle mark.

FIG. 7A shows probe needles (bent or horizontal needles) 101 diagonally extending downwards from a probe card 102 and FIG. 7B shows contact statuses in case of using the probe needles 101. First, a mounting table is moved upwards, whereby the probe needle 101 makes a contact with an electrode pad 103 (dotted lines in FIG. 7B). Thereafter, when the mounting table is further moved upwards slightly (to perform so-called "overdriving"), the probe needle 101 is bent and a tip thereof slides to a side, whereby a native oxide film 105 formed on the surface of the electrode pad 103 is rended (solid lines in FIG. 7B). Therefore, the probe needle 101 can be securely contacted with the electrode pad 103, and the needle mark confirmation process can be facilitated.

Meanwhile, FIG. 8A shows probe needles 104 vertically extending downwards from a probe card 102. When a rising speed of a wafer is so fast during an overdriving, a tip of the probe needles 104 can rend the electrode pad 103, whereby IC chips can be damaged. Further, the probe needles 104 also can be damaged by an impact caused by the contact of the probe needle 104 and the electrode pad 103. Therefore, a wafer needs to be raised gently during the overdriving. However, since the probe needles 104 stretch out vertically and heights of the tips thereof are not exactly same, the probe needle 104 may not penetrate through or rend the native oxide film 105, thereby resulting in a poor conductivity. Further, a great force can be applied to the electrode pad 103 and the probe needle 104 in a vertical direction, so that the probe needle 104 and/or the IC chips can get damaged. Furthermore, since a needle mark formed on the electrode pad 103 is a point, it is difficult to perform image recognition.

Japanese Patent Laid-open Application No. H6-124985 (especially para. 0011) discloses a technique in which a wafer is moved in a horizontal direction after performing overdriving of the vertical probe needles 104. However, as shown in FIG. 8B, the probe needle 104 is stuck into the electrode pad 103 by the overdriving. Therefore, when the electrode pad 103 moves in a horizontal direction the probe needle 104 may be bent without tearing the native oxide film 105. Moreover, probe needles 104 can be damaged.

SUMMARY OF THE INVENTION

In view of the foregoing, the present invention provides a technique capable of obtaining a fine conductivity between probe needles of a vertical type and electrode pads of an object to be inspected by bringing the probe needles to make a contact with the electrode pads, and leaving appropriate sized needle marks on the electrode pads.

In accordance with a first aspect of the present invention, there is provided a probing method for measuring electrical characteristics of an object to be inspected by bringing a probe needle into contact with an electrode pad of the object, the probe needle formed to be vertically pointing the object, including the steps of: (a) mounting the object on a mounting table; (b) aligning the object and the probe needle; (c) thereafter, contacting the probe needle with the electrode pad by moving the mounting table upwards, and then (d) moving the mounting table vertically upwards while moving same horizontally to rend an oxide film formed on a surface of the electrode pad, so that a tip of the probe needle is stuck into the electrode pad and the probe needle and the electrode pad electrically conduct with each other.

Preferably, the contacting step (c) is performed by moving the mounting table upwards to bring the probe needle to make a contact with the electrode pad at a shifted position off the center of thereof.

Further, the moving step (d) may include making the tip of the probe needle to move in a direction from the shifted position toward the center of the electrode pad by linearly moving the mounting table in a horizontal direction by a distance which is about two times the distance from the shifted position to the center of the electrode pad.

A rising speed of the mounting table in the contacting step (c) is preferably faster than that of the mounting table in the moving step (d).

In accordance with a second aspect of the present invention, there is provided a probe apparatus for measuring electrical characteristics of an object to be inspected by aligning the object and a probe needle and bringing the probe needle to make a contact with an electrode pad of the object, the probe needle being formed vertically toward the object, including: a driving mechanism for moving a mounting table in a horizontal and a vertical direction; and a control unit for outputting control signals to the driving mechanism to move the mounting table upwards to thereby making the probe needle contact with the electrode pad of the object disposed on the mounting table, and then to move the mounting table vertically and horizontally for allowing a tip of the probe needle to be stuck into the electrode pad, thereby rending an oxide film formed on the surface of the electrode pad and making the electrode pad and the probe needle electrically contact to each other.

When contacting the probe needle with the electrode pad, the control unit may output a control signal for moving the mounting table upwards to make the probe needle contact with the electrode pad at a shifted position off the center thereof. Further, when making the tip of the probe needle to be stuck into the electrode pad, the control unit may output a control signal for making the tip of the probe needle to move in a direction from the shifted position toward the center of the electrode pad by linearly moving the mounting table in a horizontal direction by a distance which is about two times the distance from the shifted position to the center of the electrode pad.

Preferably, the control unit outputs the control signals to control a rising speed of the mounting table when making the tip of the probe needle stick into the electrode pad to be slower than that of the mounting table when making the probe needle contact with the electrode pad.

In accordance with a third aspect of the present invention, there is provided a computer-readable storage medium, which stores therein a computer-executable program for use in a probing method for measuring electrical characteristics of an object to be inspected by contacting a probe needle with an electrode pad of the object, wherein the control program is configured with steps to perform the probing method described in the above aspects.

In accordance with the aspects of the present invention, in performing probing by using probe needles formed vertically toward an object to be inspected, the object is moved up to bring probe needles to make a contact with electrode pads and, then, the object is moved in a horizontal as well as a vertical direction, so that tips of the probe needles are stuck in the electrode pads and rend the surfaces of the electrode pads to the side direction. Therefore, an oxide film formed on the surface of the electrode pad can be smoothly stretched, thereby securing a good conductivity between the electrode pads and probe needles, restraining a great force applied to the probe needles and the object in a vertical direction, and leaving needle marks of a large size on the electrode pads.

BRIEF DESCRIPTION OF THE DRAWINGS

The objects and features of the present invention will become apparent from the following description of embodiments given in conjunction with the accompanying drawings, in which:

FIGS. 7A and 7B provide explanatory diagrams of a conventional probe needle formed diagonally toward an electrode pad, in which FIG. 7A shows probe needles diagonally extending downwards from a probe card and FIG. 7B shows contact statuses in case of using the probe needles; and FIGS. 8A and 8B present explanatory diagrams of a conventional probe needle formed vertically toward an electrode pad, in which FIG. 8A shows probe needles vertically extending downwards from a probe card, and FIG. 8B shows the probe needle being stuck into the electrode pad by the overdriving.

DETAILED DESCRIPTION OF THE EMBODIMENTS

Figure 1:
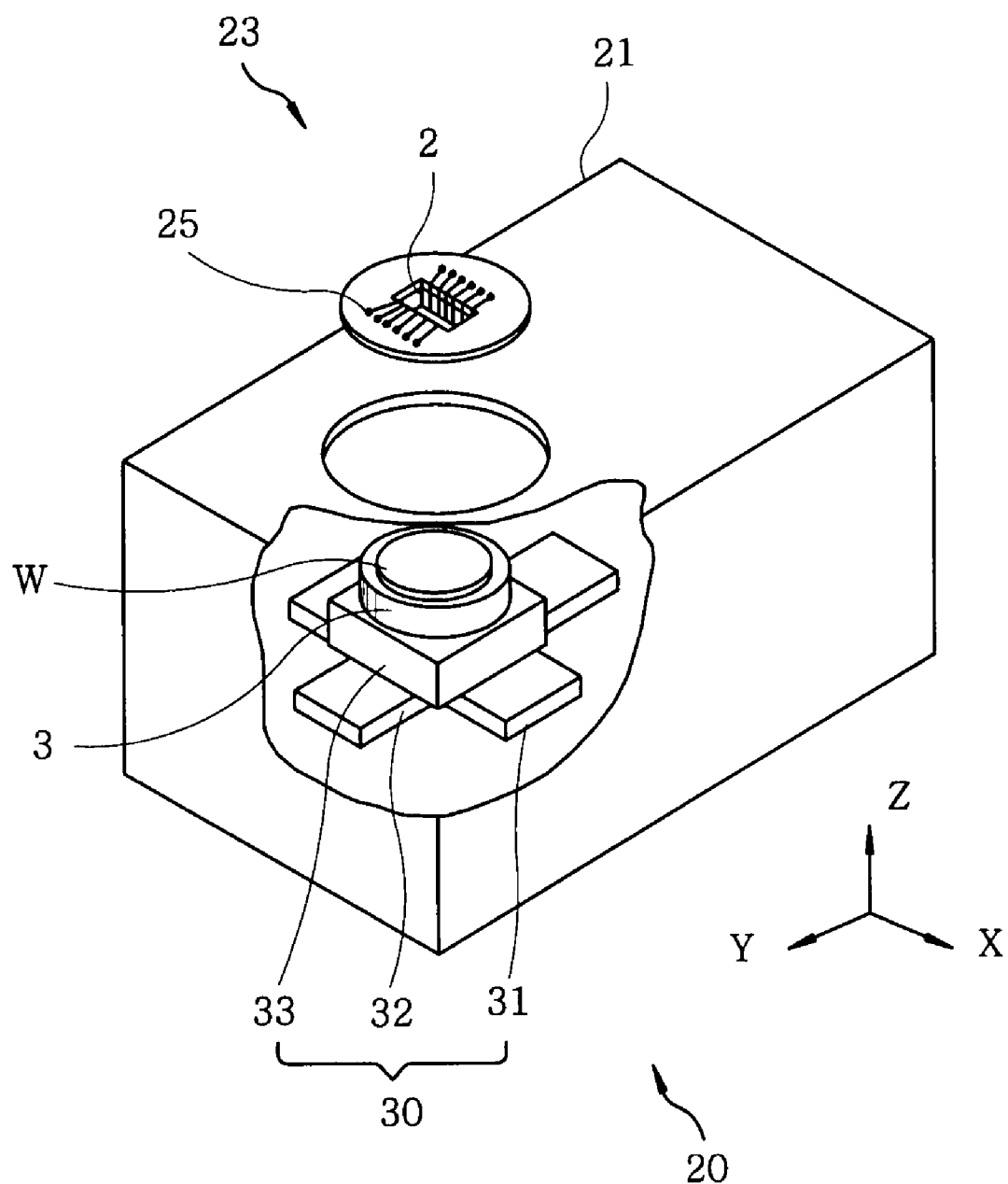
FIG. 1 provides a prospective view of a probe apparatus for performing a probing method in accordance with the present invention.
Figure 2:
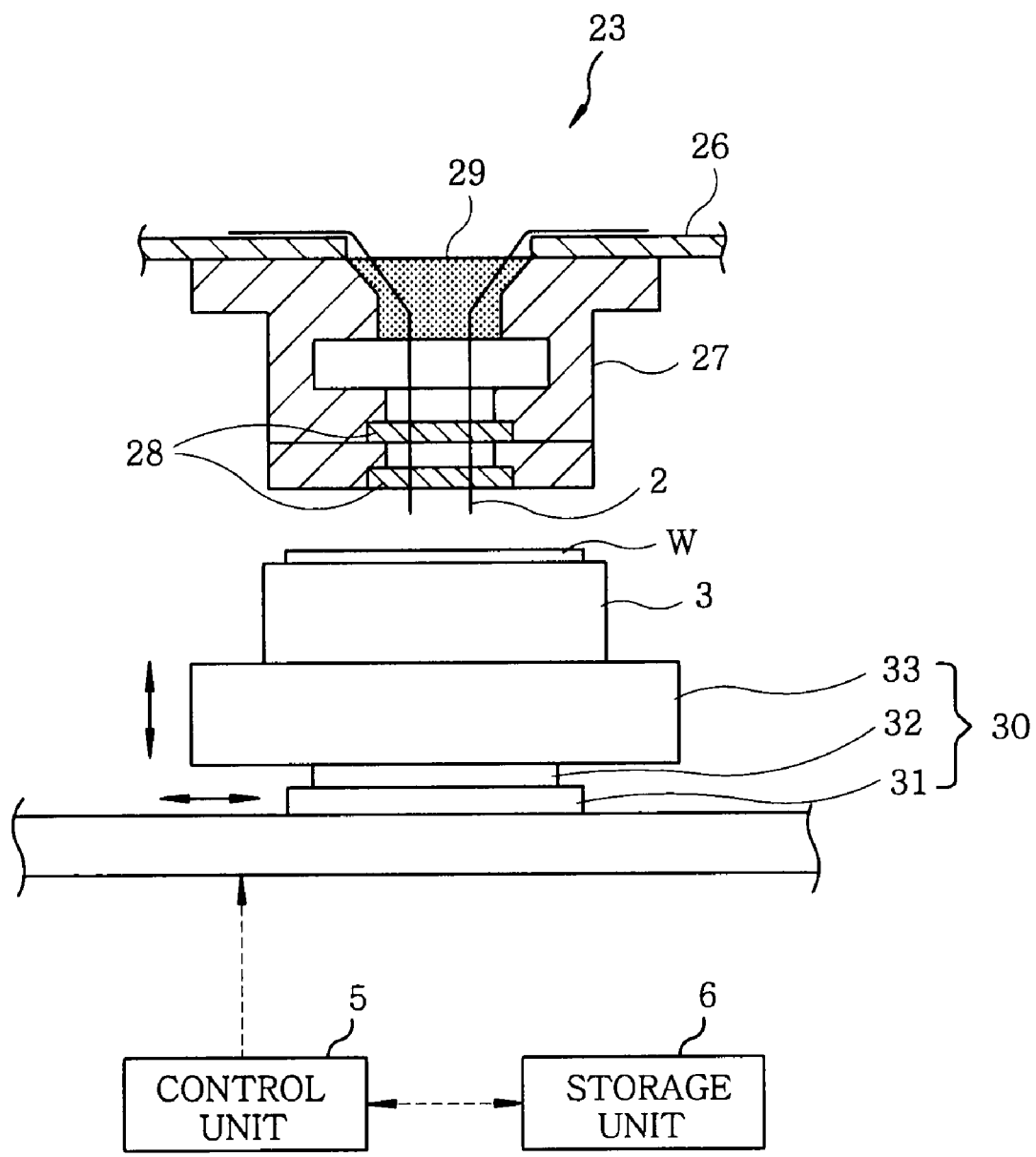
FIG. 2 is a vertical cross sectional view of the probe apparatus.

A probe apparatus 20 for performing a probing method in accordance with an embodiment of the present invention will be described with reference to FIGS. 1 and 2. The probe apparatus 20 includes a housing 21 forming the exterior part thereof and an XYZ stage 30 used as a driving mechanism on a bottom surface in the housing 21. The XYZ stage 30 has an X-direction moving unit 31, a Y-direction moving unit 32 and a Z-direction moving unit 33 which include a ball screw, a guide mechanism and a pulse motor. Further, a mounting table 3 is provided on the Z-direction moving unit 33 to mount thereon a wafer to be inspected.

Attached horizontally in a top surface of the housing 21 is a probe card 23 which functions as an installation member installed with probe needles 2 therein. The probe card 23 includes a print substrate 26 arranged with electrodes 25 and a block body 27 provided under the print substrate 26. The electrodes 25 are electrically connected to the vertical probe needles 2, respectively. A plurality of guide plates 28, e.g. two plates, vertically overlapped are disposed at the lower side of the block body 27 for guiding the probe needles 2. The probe needles 2 are provided at the upper side of the block 27 and are fixed by a resin material 29. A surface including tips of the probe needles 2 is set to be parallel with a mounting surface (surface of a wafer W) of the mounting table 3.

Provided in the probe apparatus 20 is, e.g., a control unit 5 which is, e.g., a computer, and the control unit 5 includes a data processing unit having a program, a memory and a CPU. The program is organized with commands for sending control signals to the respective units in the probe apparatus 20 from the control unit 5 and performing a wafer transfer or a measurement of electrical characteristics of the wafer W. Further, for example, the memory has an area for recording therein processing parameters such as measurement signals and the like, e.g., a moving speed or a moving amount of the XYZ stage 30, or a current value flowing from the electrodes 25 to the probe needles 2.

When the CPU executes each command in the program, the processing parameter thereof is read, and the control signal corresponding to the parameter value is sent to each part of the probe apparatus 20. The program (including an input manipulation or a display of the processing parameters) is stored in a storage unit 6 which is a computer-readable storage medium, e.g., a flexible disc, a compact disc, MO (magneto-optical disc), a hard disk and the like, and installed in the control unit 5.

Figure 3:
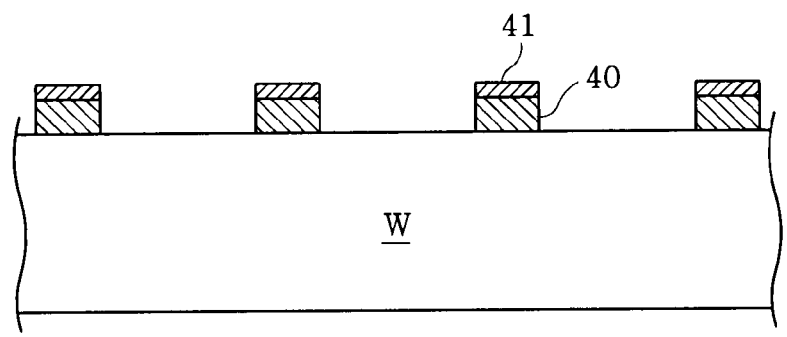
FIG. 3 presents a vertical cross sectional view of an example of a substrate to be applied in the probing method.

Here, a wafer W of which electrical characteristics are inspected by employing the probing method will be explained referring to FIG. 3. IC chips formed on the surface of the wafer W are provided with horn-shaped electrode pads 40 made of a metal such as aluminum or the like. The surface of each electrode pad is formed with an ultra-thin oxide film 41. The oxide film 41 is a native oxide film which is generated by exposing the wafer W in the air after forming the IC chips and allowing the surface thereof to make a contact with oxygen and the like in the air.

Next, the probing method in accordance with the embodiment of the present invention will be explained. First, a wafer W is aligned in a position. In other words, a wafer W is mounted on the mounting table 3 by a transfer unit (not shown); positions of an alignment trace (not shown) formed on the wafer W and the probe needles 2 are detected by an imaging unit (not shown) such as a CCD camera or the like; and positions of the probe needles 2 and horizontal directions (x and Y directions and a rotational direction around a vertical axis) of the wafer W are arranged, and simultaneously, an initial position of the mounting table 3 is set by the XYZ stage 30 to be located at a position lower than tips of the probe needles 2 by a specific distance. Further, the alignment operation is accurately performed based on information obtained in advance by considering distortion of the XYZ stage 30.

Figure 4:
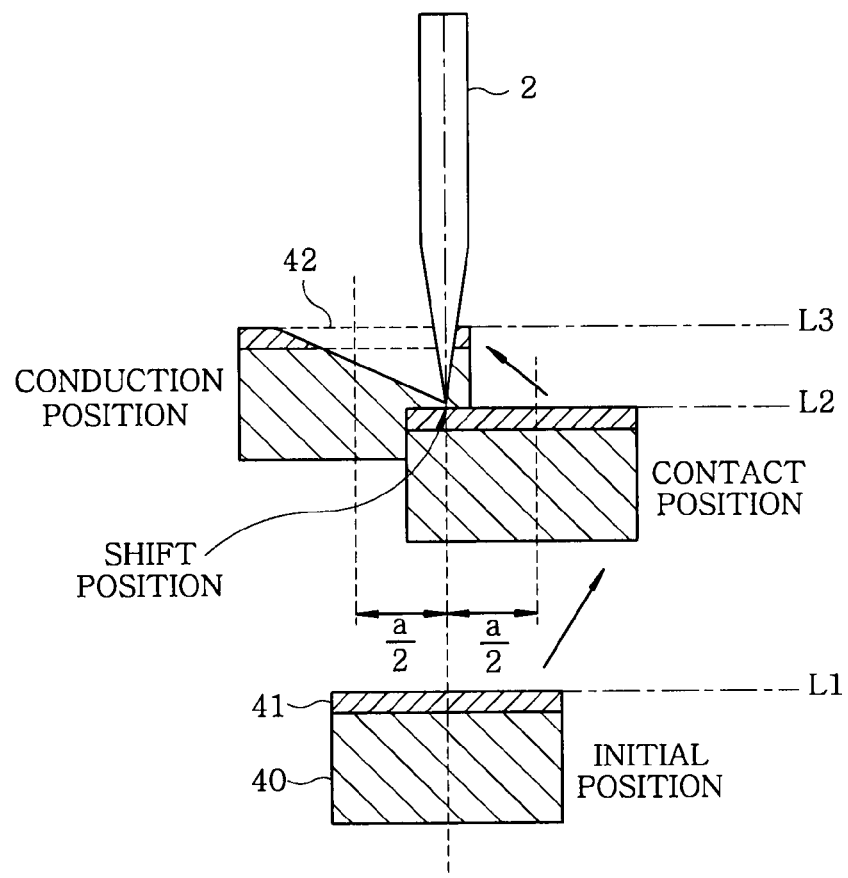
FIG. 4 illustrates a moving trace of an electrode pad in the probing method.

Next, the mounting table 3 is moved by the XYZ stage 30 to bring the probe needles 2 to make a contact with the electrode pads 40. Specifically, the mounting table 3 is moved to bring the tips of the probe needles 2 to make a contact with the electrode pads 40 such that each contact position is shifted by a specific distance away from the center thereof. FIG. 4 is a diagram presenting the statuses. A wafer surface (surface of the electrode pad 40 including the oxide film 41) is moved upwards from a height level L1 to a height level L2, whereby a tip of the probe needle 2 contacts to the surface of the electrode pad 40 (surface of the oxide film 41).

When a length of the needle mark 42 formed on the electrode pad 40 is, e.g., "a", the contact position is preferably a shifted position off the center of the electrode pad 40 about a half length of "a" (i.e., about a/2), and the XYZ stage 30 is controlled to make a contact at this position. At this time, the mounting table 3 is controlled to move at a high speed, as conventionally known, until the probe needle 2 and the electrode pad 40 (oxide film 41) are contacted. After contacting the probe needle 2 with the electrode pad 40 (oxide film 41), the mounting table 3 is moved as an overdriving process, as described below.

In other words, the mounting table 3 is moved linearly in horizontal direction by about a distance of "a" from the above-described contact position toward the center position of the electrode pad 40 to form the needle mark 42 of the probe needle 2, while moving the mounting table upwards. The orientation of the wafer W is controlled to make one vertical side and one horizontal side of the electrode pad of the each IC chip respectively to be aligned along X direction and Y direction which are moving directions of the XYZ stage 30.

Therefore, a definition of the horizontal direction here is, e.g., the X direction or the Y direction. By the overdriving process, the electrode pad 40 is moved to a conduction position of a height level L3, so that the tip of the probe needle 2 is gently moved downwards in a relatively diagonal manner to the electrode pad 40. Therefore, the probe needle 2 rends the oxide film 41 formed on the surface of electrode pad and sticks in the electrode pad 40, thereby securing conduction (electrical contact) between the probe needle 2 and electrode pad 40.

Figure 5:
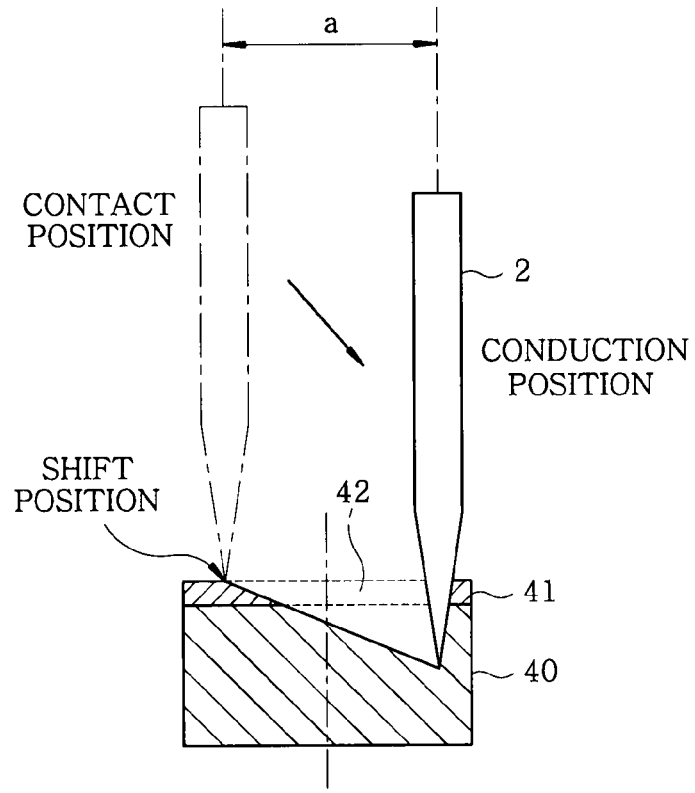
FIG. 5 shows a moving trace of a probing needle when the electrode pads are assumed to be fixed.
Figure 6:
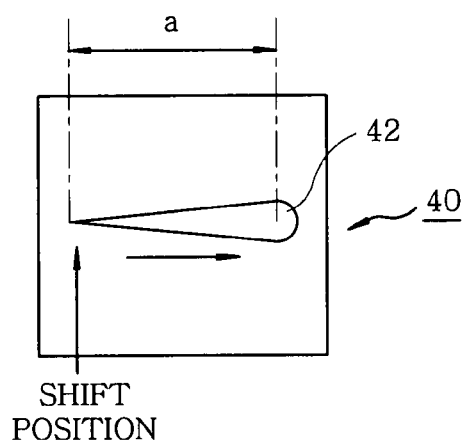
FIG. 6 shows a top view of a top surface of the electrode pad inspected after performing overdriving process in the probing method.

FIG. 4 is the diagram presenting position shifts of a random electrode pad 40 when the electrode pad 40 (wafer W) is moved by the mounting table 3, as described above. Meanwhile, FIG. 5 is a schematic diagram reproducing the relative situation in the FIG. 4 by assuming that the position of the electrode pad 40 is fixed instead. From FIGS. 4 and 5, it is found that the probe needle 2 is moved in horizontal direction to the electrode pad 40 while being stuck therein. FIG. 6 shows a status obtained by inspecting the top surface (inspecting from the side of the probe needle 2) of the electrode pad 40 after the overdriving process. A probe mark 42 is formed on the surface of the electrode pad 40 (i.e., electrode pad 40 and oxide film 41) in the overdriving process, the probe mark 42 having a width gradually being widened according to a diameter of the probe needle 2.

At this time, a moving speed of the mounting table 3 when making the tip of the probe needle 2 stick into the electrode pad 40 is set to be much slower than that of the mounting table 3 when the probe needle 2 is contacted with the electrode pad 40.

Thereafter, inspections of electrical characteristics are initiated to perform by a specific inspection signals sent from the electrode 25 to the electrode pad 40 via the probe needle 2.

Further, whenever processing a specific number of wafers W, needle marks 42 formed on the electrode pads 40 are imaged by an image processing device (not shown), whereby an image inspection is performed to figure out whether the probe needles 2 are respectively contacted with the electrode pads 40 or not.

In accordance with the embodiment of the present invention, in the probing performed by the vertically extended probe needles 2 from the probe card 23, the wafer W is moved upwards to bring the probe needles 2 to make a contact with the electrode pads 40, while moving the same in a horizontal direction. Accordingly, the tip of the probe needle 2 diagonally scratches the oxide film 41 formed on the surface of the electrode pad 40, thereby easily peeling the oxide film 41 and securing the conductivity between the electrode pad 40 and probe needle 2. Therefore, inspections of electrical characteristics of IC chips formed on a wafer W can be performed satisfactorily.

Figure 8A:
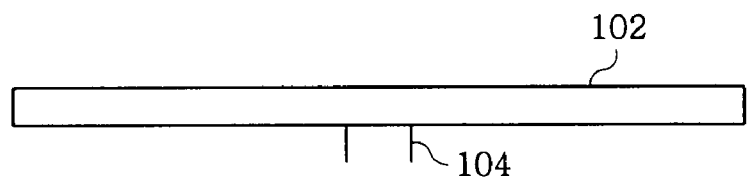
Figure 8B:
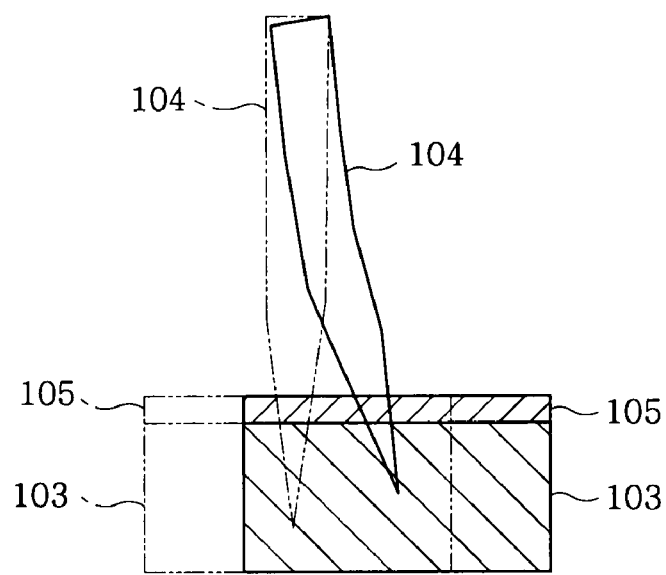

Further, in accordance with the embodiment of the present invention, the electrode pad 40 is moved in a horizontal direction while the tip of the probe needle 2 is gradually stuck in the electrode pad 40 by moving the mounting table 3 slowly, in contrast to the way performed in FIG. 8B in which the electrode pad 103 is moved after sticking the tip of the probe needle 102 deeply in the electrode 103. Accordingly, an impact applied to the probe needle 2 and the electrode pad 40 is dispersed in a horizontal and a vertical direction without applying a great force in a vertical direction, whereby bending of the probe needle 2, or damage of the probe needle 2 or the IC chip can be prevented. Therefore, the tip of the probe needle 2 can be certainly received in the electrode pad 40.

Figure 7A:
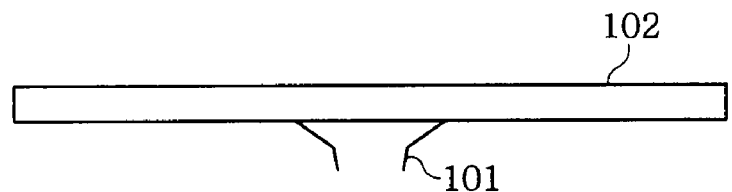
Figure 7B:
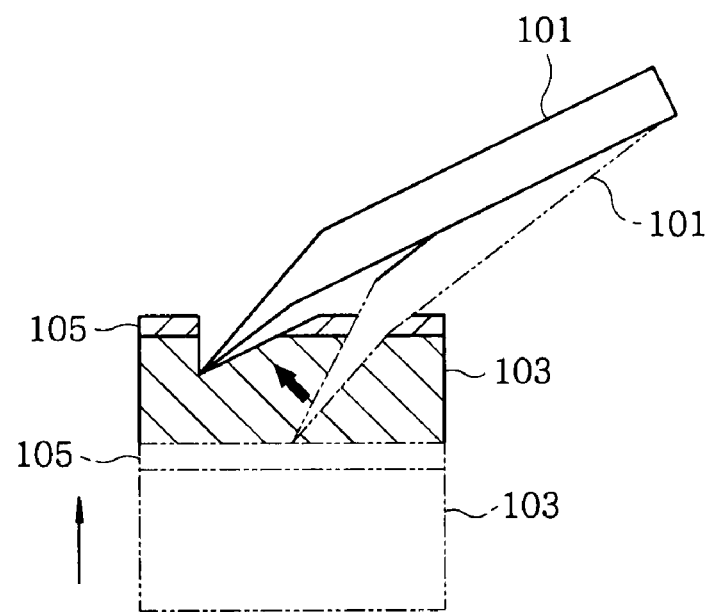

As shown in FIGS. 5 to 7, even though the probe needle 2 is formed vertically pointing the electrode pad 40, the probe needle 2 draws similar trace to that of the probe needle 104 which is a bent or horizontal needle and forms the needle mark 42 of a large size. Therefore, when the imaging inspection is performed thereafter, it is determined with a high precision whether the probe needle 2 is contacted with the electrode pad 40 or not.

Further, in the above described example, the horizontal moving distance of the mounting table 3 from the initial position to the contact position and the horizontal moving distance of the mounting table 3 in the overdriving process are set to be same as a length of a/2. However, the distances may be different from each other as far as the tip of the probe needle 2 stays on the electrode pad 40. Further, although the probe needle 2 and the center of electrode pad 40 are set in a same position and the mounting table 3 is moved upwards to bring the electrode pad 40 into contact with the probe needle 2 in the shift position, the mounting table 3 may be moved to the shift position in advance as an initial position, and then the mounting table 3 may be vertically moved upwards.

Further, the probe needle 2 is contacted with the electrode pad 40 in the shift position to form a long needle mark 42. However, when no imaging inspection is performed, the mounting table 3 may be vertically moved upwards from the initial position to bring the electrode pad 40 to make a contact with the probe needle 2, and, then the overdriving process may be performed.

Further, as described above, even though the mounting table 3 is moved at a fast speed until the probe needle 2 is contacted with the electrode pad 40, the mounting table 3 may be moved at a same speed thereafter.

While the invention has been shown and described with respect to the embodiments, it is understood by those skilled in the art that various changes and modifications may be made without departing from the scope of the invention as defined in the following claims.

What is claimed is:

1. A probing method for measuring electrical characteristics of an object to be inspected by bringing a probe needle to make a contact with an electrode pad of the object, the probe needle being vertically formed toward the object, comprising: (a) mounting the object on a mounting table; (b) aligning the object and the probe needle; (c) after the aligning, contacting the probe needle with the electrode pad by moving the mounting table vertically upwards to an initial contact position; and then (d) moving the mounting table vertically upwards toward the probe needle while moving the mounting table horizontally to rend an oxide film formed on a surface of the electrode pad, so that a tip of the probe needle is stuck into the electrode pad to form a rend mark and the probe needle and the electrode pad electrically conduct with each other in a conduction position, and, after the moving is completed, a depth of the rend mark in a vertically downward direction into the electrode pad is increased from the initial contact position to the conduction position and a width of the rend mark in a horizontal direction along a top surface of the electrode pad increases from the initial contact position to the conduction position.

2. The method of claim 1, wherein the contacting step (c) is performed by moving the mounting table vertically upwards to bring the probe needle to make a contact with the electrode pad at the initial contact position which is a shifted position off a center of the electrode pad, and
wherein the moving step (d) includes making the tip of the probe needle move in a direction from the shifted position toward the center of the electrode pad by linearly moving the mounting table in a horizontal direction by a distance which is about two times a distance from the shifted position to the center of the electrode pad.

3. The method of claim 1, wherein, a rising speed of the mounting table in the contacting step (c) is faster than that of the mounting table in the moving step (d).

4. A computer-readable storage medium, which stores therein a computer-executable program for use in a probing method for measuring electrical characteristics of an object to be inspected by contacting a probe needle with an electrode pad of the object, wherein the control program is configured to perform the probing method described in claim 1.

5. A probe apparatus for measuring electrical characteristics of an object to be inspected by aligning the object and a probe needle and bringing the probe needle to make a contact with an electrode pad of the object, the probe needle being formed vertically toward the object, comprising: a driving mechanism that moves a mounting table in a horizontal direction and a vertically upward direction; and a control unit that outputs control signals to the driving mechanism to move the mounting table vertically upwards to thereby make the probe needle contact with the electrode pad of the object disposed on the mounting table in an initial contact position, and then to move the mounting table in the vertically upward direction toward the probe needle and the horizontal direction simultaneously to allow a tip of the probe needle to be stuck into the electrode pad, thereby rending an oxide film formed on the surface of the electrode pad to form a rend mark and making the electrode pad and the probe needle electrically contact each other in a conduction position, and, after the moving is completed, a depth of the rend mark in a vertically downward direction into the electrode pad is increased from the initial contact position to the conduction position and a width of the rend mark in the horizontal direction along a top surface of the electrode pad increases from the initial contact position to the conduction position.

6. The apparatus of claim 5, wherein when contacting the probe needle with the electrode pad, the control unit outputs a control signal for moving the mounting table vertically upwards to make the probe needle contact with the electrode pad at the initial contact position which is a shifted position off a center of the electrode pad, and
wherein when making the tip of the probe needle to be stuck into the electrode pad, the control unit outputs a control signal for making the tip of the probe needle move in a direction from the shifted position toward the center of the electrode pad by linearly moving the mounting table in the horizontal direction by a distance which is about two times a distance from the shifted position to the center of the electrode pad.

7. The apparatus of claim 5, wherein the control unit outputs the control signals to control a rising speed of the mounting table when making the tip of the probe needle stick into the electrode pad to be slower than that of the mounting table when making the probe needle contact with the electrode pad.

8. A probing method for measuring electrical characteristics of an object to be inspected by bringing a probe needle to make a contact with an electrode pad of the object, the probe needle being vertically formed toward the object, comprising: (a) mounting the object on a mounting table; (b) aligning the object and the probe needle; (c) after the aligning, contacting the probe needle with the electrode pad in an initial contact position by moving the mounting table vertically upwards; and then (d) moving the mounting table in a vertically upward direction toward the probe needle and a horizontal direction simultaneously to rend an oxide film formed on a surface of the electrode pad, so that a tip of the probe needle is stuck into the electrode pad to form a rend mark and the probe needle and the electrode pad electrically conduct with each other in a conduction position, and, after the moving is completed, a depth of the rend mark in a vertically downward direction into the electrode pad is increased from the initial contact position to the conduction position and a width of the rend mark in the horizontal direction along a top surface of the electrode pad increases from the initial contact position to the conduction position.

9. The method of claim 8, wherein the contacting step (c) is performed by moving the mounting table vertically upwards to bring the probe needle to make a contact with the electrode pad at a shifted position off a center of the electrode pad, and
wherein the moving step (d) includes making the tip of the probe needle move in a direction from the shifted position toward the center of the electrode pad by linearly moving the mounting table in the horizontal direction by a distance which is about two times a distance from the shifted position to the center of the electrode pad.

10. The method of claim 8, wherein, a rising speed of the mounting table in the contacting step (c) is faster than that of the mounting table in the moving step (d).

11. A computer-readable storage medium, which stores therein a computer-executable program for use in a probing method for measuring electrical characteristics of an object to be inspected by contacting a probe needle with an electrode pad of the object, wherein the control program is configured to perform the probing method described in claim 8.

* * * * *